(12) United States Patent
Tomikawa et al.

(10) Patent No.: US 9,955,591 B2
(45) Date of Patent: Apr. 24, 2018

(54) CIRCUIT SUBSTRATE AND METHOD FOR MANUFACTURING THE SAME

(71) Applicant: IBIDEN CO., LTD., Ogaki (JP)

(72) Inventors: Mitsuhiro Tomikawa, Ogaki (JP); Koji Asano, Ogaki (JP)

(73) Assignee: IBIDEN CO., LTD., Ogaki (JP)

( * ) Notice: Subject to any disclaimer, the term of this patent is extended or adjusted under 35 U.S.C. 154(b) by 113 days.

(21) Appl. No.: 14/802,139

(22) Filed: Jul. 17, 2015

(65) Prior Publication Data

US 2016/0021753 A1 Jan. 21, 2016

(30) Foreign Application Priority Data

Jul. 17, 2014 (JP) ................................. 2014-146770

(51) Int. Cl.
| H05K 1/18 | (2006.01) |
| H05K 3/46 | (2006.01) |
| H05K 7/00 | (2006.01) |
| H05K 1/16 | (2006.01) |
| H05K 1/02 | (2006.01) |
| H05K 3/34 | (2006.01) |

(52) U.S. Cl.
CPC .......... *H05K 3/4697* (2013.01); *H05K 1/185* (2013.01); *H05K 1/0206* (2013.01); *H05K 1/162* (2013.01); *H05K 3/3436* (2013.01); *H05K 3/4644* (2013.01); *H05K 2201/10* (2013.01); *H05K 2201/10045* (2013.01); *H05K 2201/10416* (2013.01)

(58) Field of Classification Search
CPC .... H05K 1/185; H05K 2201/10; H05K 1/162; H05K 2201/10045

USPC .................................. 361/761–764, 782, 783
See application file for complete search history.

(56) References Cited

U.S. PATENT DOCUMENTS

| 5,642,261 A * | 6/1997 | Bond ................... H01L 23/3128 257/707 |
| 2012/0043127 A1* | 2/2012 | Lin ....................... H05K 1/0203 174/266 |
| 2012/0186866 A1 | 7/2012 | Mikado et al. |

(Continued)

OTHER PUBLICATIONS

U.S. Appl. No. 14/791,735, filed Jul. 6, 2015, Tomikawa, et al.
U.S. Appl. No. 14/791,641, filed Jul. 6, 2015, Tomikawa, et al.

*Primary Examiner* — Binh Tran
(74) *Attorney, Agent, or Firm* — Oblon, McClelland, Maier & Neustadt, L.L.P.

(57) ABSTRACT

A circuit substrate includes a core substrate having a cavity penetrating through the substrate, a combined component accommodated in the cavity of the substrate, a first build-up layer laminated on first surface of the substrate and including an insulating layer such that the insulating layer is covering the cavity, a second build-up layer laminated on second surface of the substrate and including an insulating layer such that the insulating layer is covering the cavity, and a filling resin filling gap formed between the cavity and combined component accommodated in the cavity of the substrate. The combined component includes an electronic component and a metal block, the electronic component has terminal surface on side facing the first surface of the substrate, and the metal block is superposed to surface of the electronic component on the opposite side of the electronic component with respect to the terminal surface.

20 Claims, 11 Drawing Sheets

(56) References Cited

U.S. PATENT DOCUMENTS

2013/0027896 A1\* 1/2013 Lee ................. H05K 1/185
 361/761
2014/0144677 A1\* 5/2014 Wang ................ H05K 1/0206
 174/252

\* cited by examiner

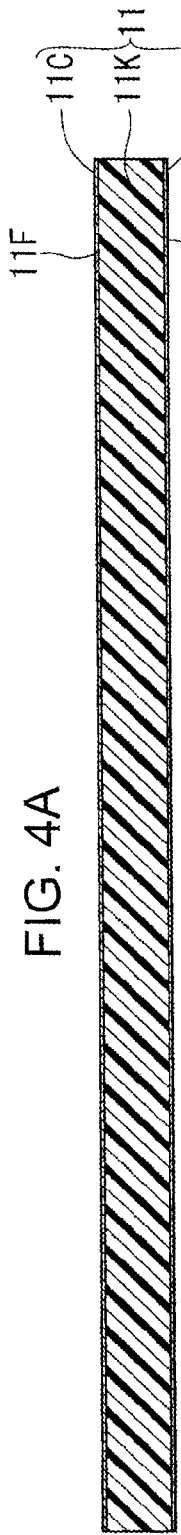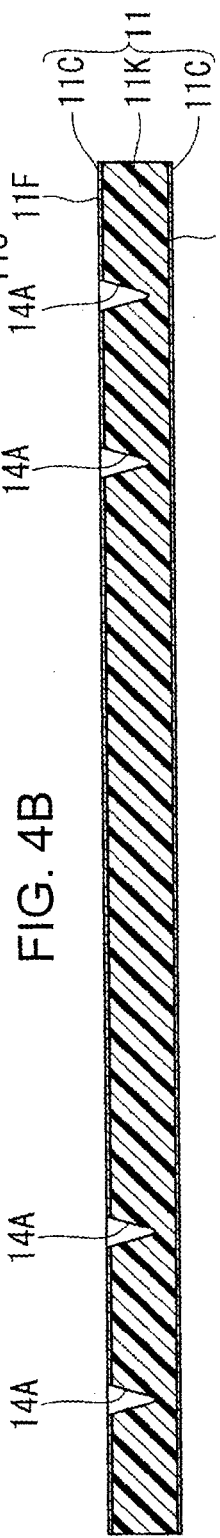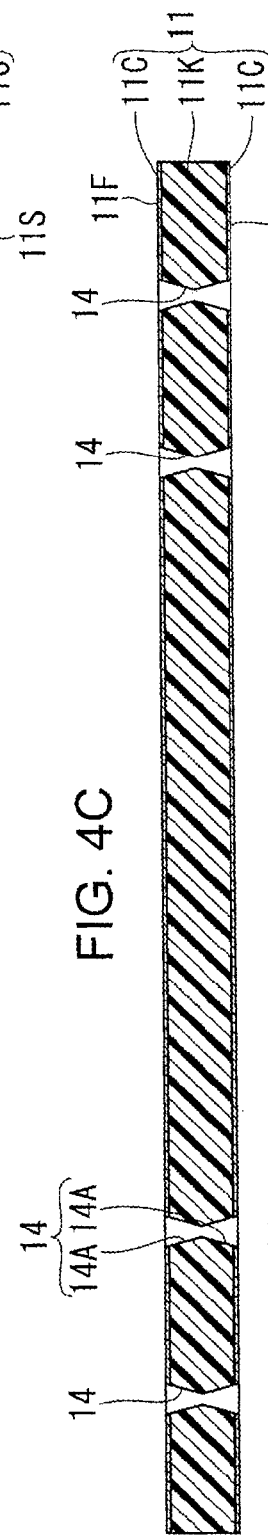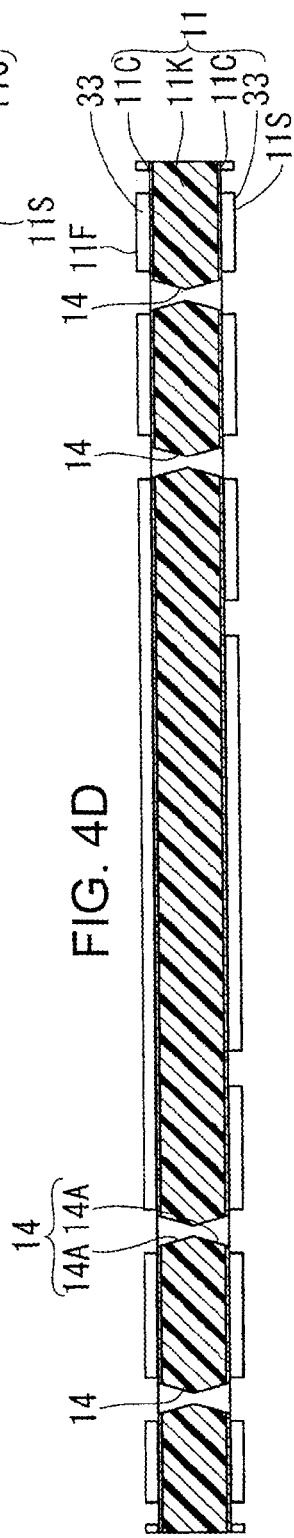

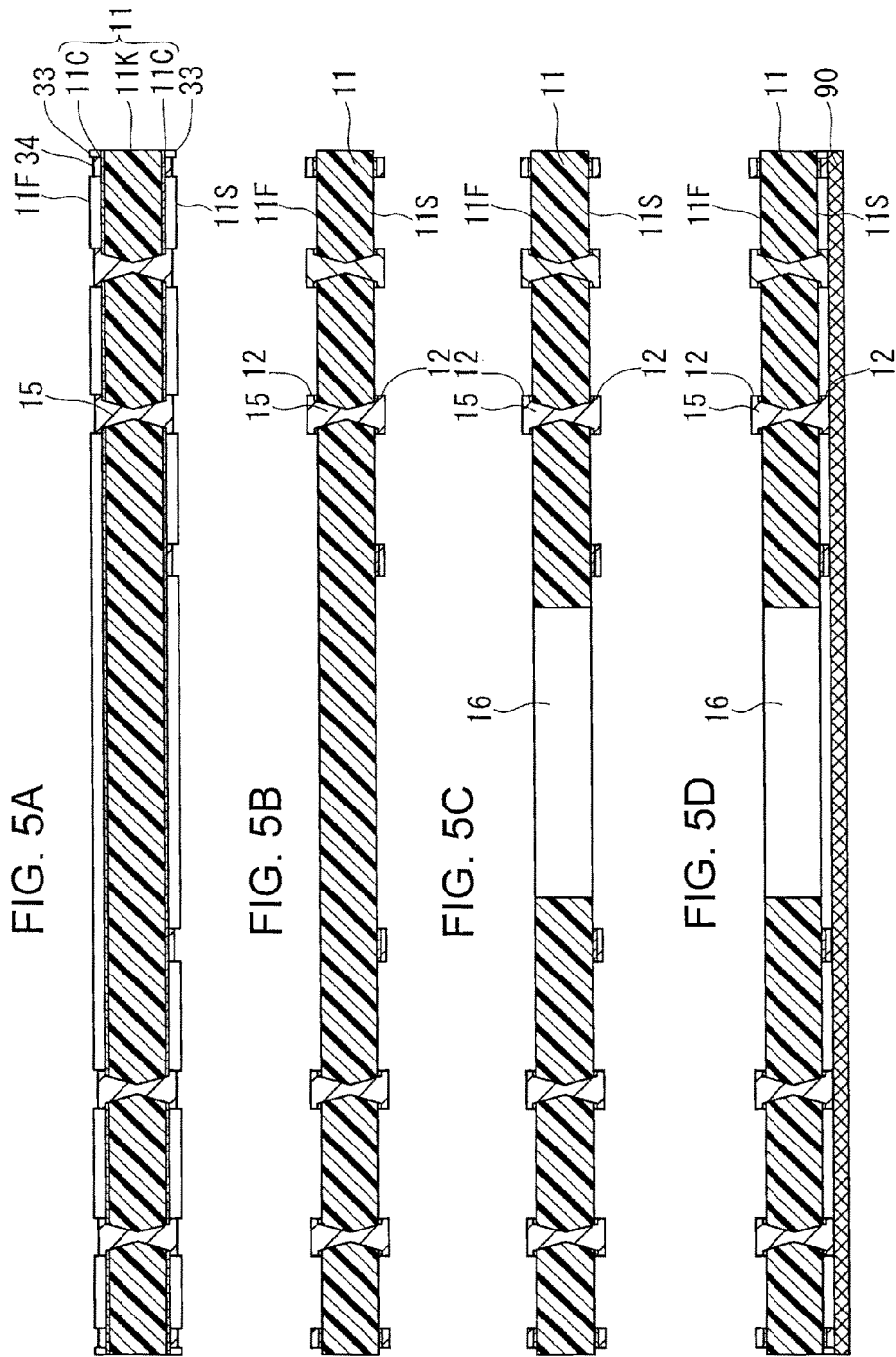

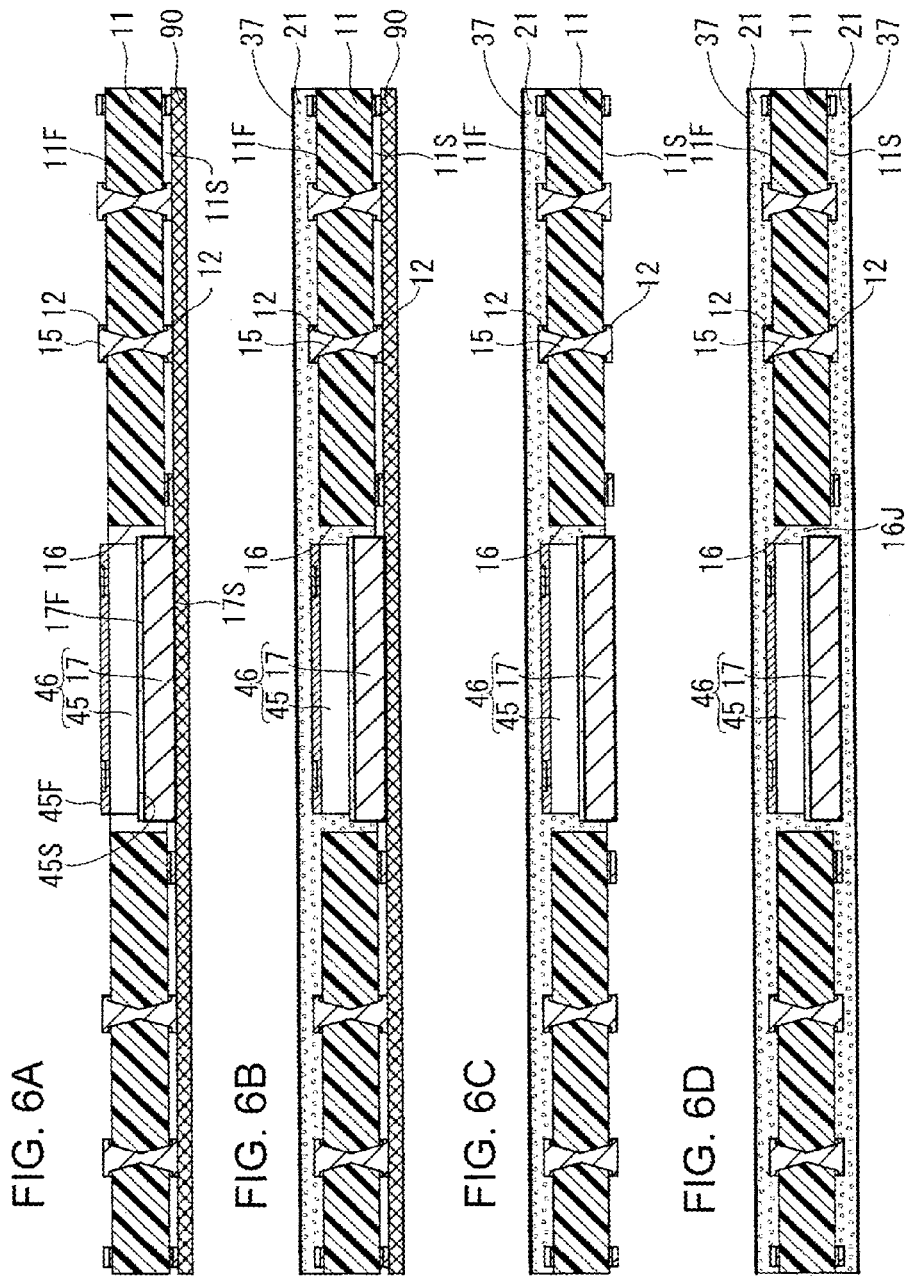

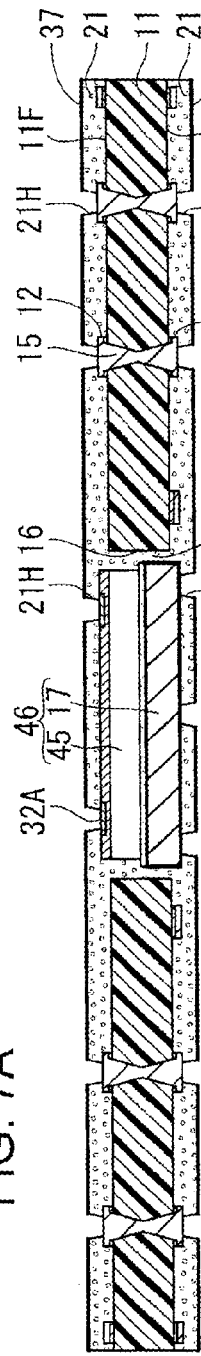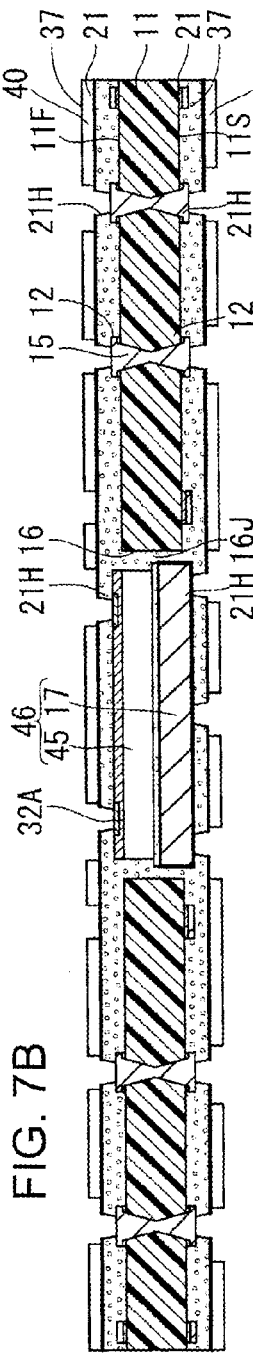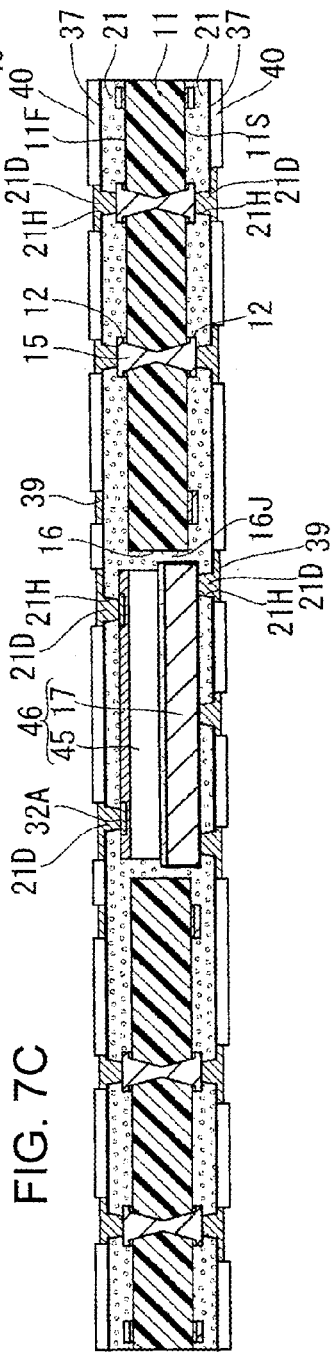
FIG. 7A
FIG. 7B
FIG. 7C

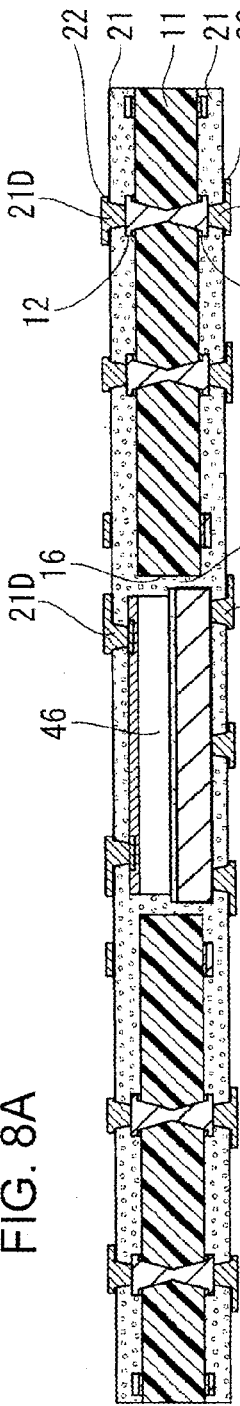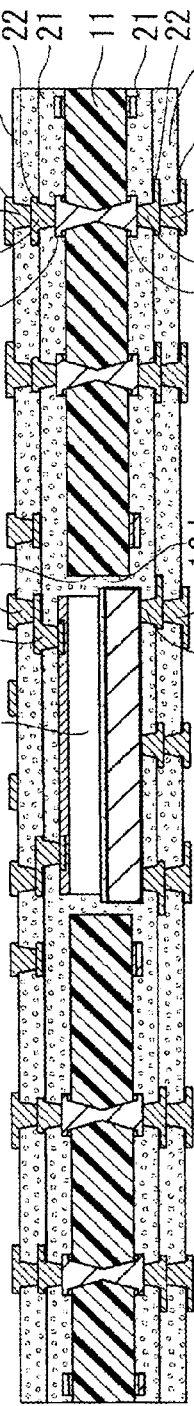

US 9,955,591 B2

CIRCUIT SUBSTRATE AND METHOD FOR MANUFACTURING THE SAME

CROSS-REFERENCE TO RELATED APPLICATIONS

The present application is based upon and claims the benefit of priority to Japanese Patent Application No. 2014-146770, filed Jul. 17, 2014, the entire contents of which are incorporated herein by reference.

BACKGROUND OF THE INVENTION

Field of the Invention

The present invention relates to a circuit substrate in which a build-up layer is laminated on a core substrate that has a cavity, and to a method for manufacturing the circuit substrate.

Description of Background Art

In a circuit substrate, an electronic component may be accommodated in a cavity (for example, US2012/0186866A1). The entire contents of this publication are incorporated herein by reference.

SUMMARY OF THE INVENTION

According to one aspect of the present invention, a circuit substrate includes a core substrate having a cavity penetrating through the core substrate, a combined component accommodated in the cavity of the core substrate, a first build-up layer laminated on a first surface of the core substrate and including an insulating resin layer such that the insulating resin layer is covering the cavity, a second build-up layer laminated on a second surface of the core substrate and including an insulating resin layer such that the insulating resin layer is covering the cavity, and a filling resin filling a gap formed between the cavity and the combined component accommodated in the cavity of the core substrate. The combined component includes an electronic component and a metal block, the electronic component has a terminal surface on a side facing the first surface of the core substrate, and the metal block is superposed to a surface of the electronic component on the opposite side of the electronic component with respect to the terminal surface.

According to another aspect of the present invention, a method for manufacturing a circuit substrate includes forming a cavity penetrating through a core substrate, proving a combined component including an electronic component and a metal block in the cavity of the core substrate, filling a filling resin into a gap formed between the cavity and the combined component accommodated in the cavity of the core substrate, forming a first build-up layer including an insulating resin layer on a first surface of the core substrate such that the insulating resin layer covers the cavity, and forming a second build-up layer including an insulating resin layer on a second surface of the core substrate such that the insulating resin layer covers the cavity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 4A-4D are cross-sectional side views illustrating manufacturing processes of the circuit substrate;

FIG. 5A-5D are cross-sectional side views illustrating manufacturing processes of the circuit substrate;

FIG. 6A-6D are cross-sectional side views illustrating manufacturing processes of the circuit substrate;

FIG. 7A-7C are cross-sectional side views illustrating manufacturing processes of the circuit substrate;

FIG. 8A-8C are cross-sectional side views illustrating manufacturing processes of the circuit substrate;

DETAILED DESCRIPTION OF THE EMBODIMENTS

Figure 1:
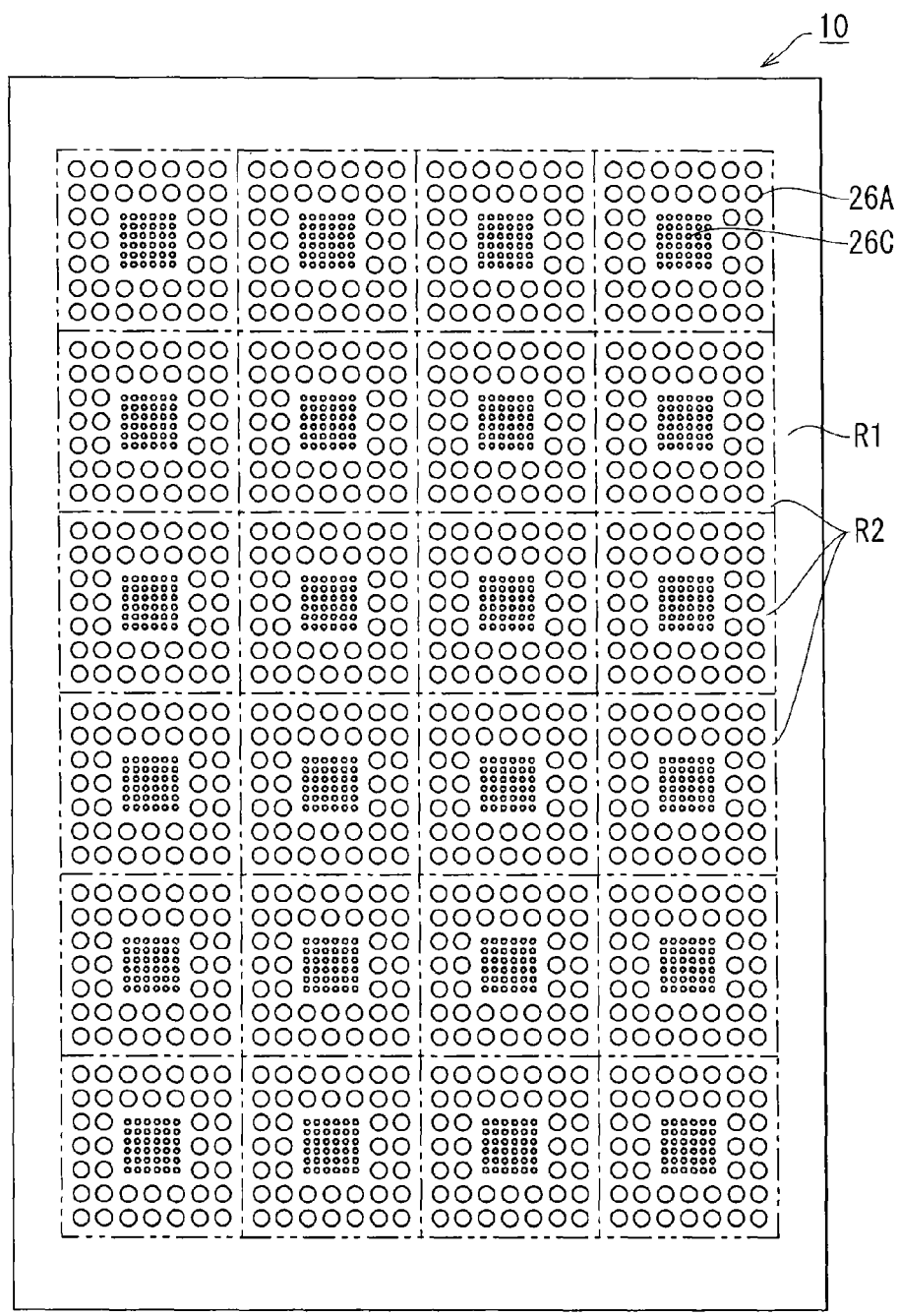
FIG. 1 is a plan view of a circuit substrate according to a first embodiment of the present invention.

The embodiments will now be described with reference to the accompanying drawings, wherein like reference numerals designate corresponding or identical elements throughout the various drawings.

First Embodiment

Figure 2:
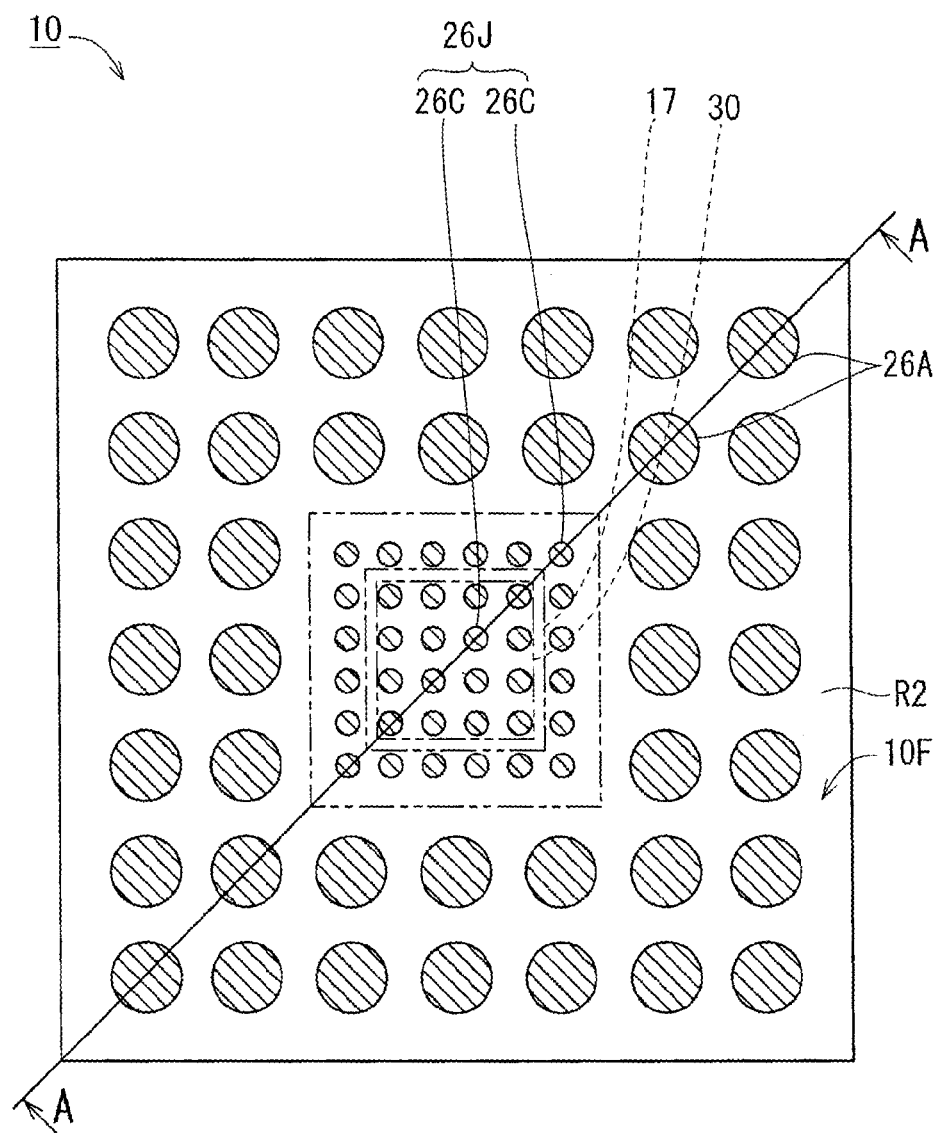
FIG. 2 is a plan view of a product region in the circuit substrate.
Figure 3:
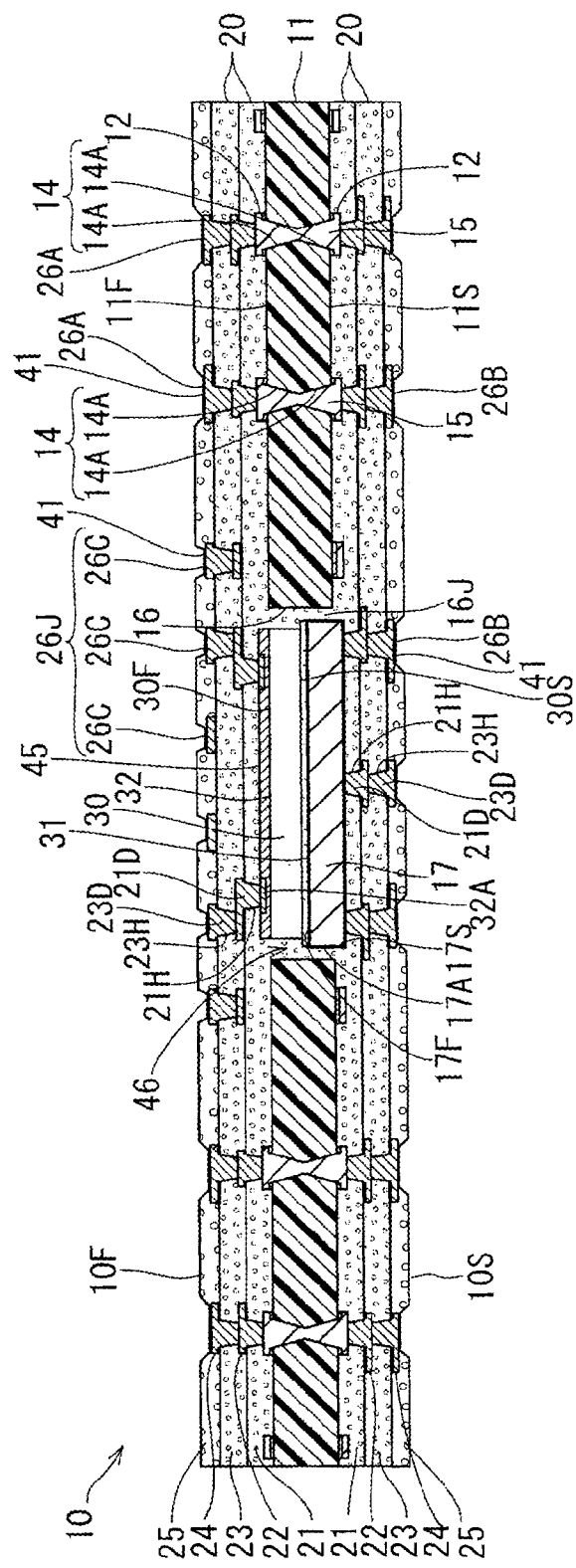
FIG. 3 is cross-sectional side view of the circuit substrate in an A-A cutting plane of FIG. 2.

In the following, a first embodiment of the present invention is described based on FIG. 1-10. As illustrated in a plan view of FIG. 1, a circuit substrate 10 of the present embodiment has, for example, a frame-shaped discard region (R1) along an outer edge, and an inner side of the discard region (R1) is divided into multiple square product regions (R2). FIG. 2 illustrates an enlarged view of one product region (R2). FIG. 3 illustrates an enlarged view of a cross-sectional structure of the circuit substrate 10, the cross section being taken by cutting the product region (R2) along a diagonal line.

As illustrated in FIG. 3, the circuit substrate 10 is structured to respectively have build-up layers 20, 20 on front and back surfaces of a core substrate 11. The core substrate 11 is formed of an insulating member. A conductor circuit layer 12 is formed on each of an F surface (11F), which is the front side surface of the core substrate 11, and an S surface (11S), which is the back side surface of the core substrate 11. Further, a cavity 16 and electrical conduction through holes 14 are formed in the core substrate 11.

The electrical conduction through holes 14 are each formed in a middle-constricted shape in which small diameter side ends of tapered holes (14A, 14A) are communicatively connected, the tapered holes (14A, 14A) being respective formed by drilling from the F surface (11F) and the S surface (11S) of the core substrate 11 and being gradually reduced in diameter toward a deep side. On the other hand, the cavity 16 is formed in a shape that has a space in a shape of a rectangular cuboid.

The electrical conduction through holes 14 are filled with plating and through-hole electrical conductors 15 are respectively formed. The conductor circuit layer 12 on the F surface (11F) and the conductor circuit layer 12 on the S surface (11S) are connected by the through-hole electrical conductors 15.

A combined component 46 formed by superposing an electronic component 45 and a metal block 17 is accommodated in the cavity 16. The metal block 17 is, for example, a flat copper cuboid. A planar shape of the metal block 17 is a quadrangular shape that is slightly smaller than a planar shape of the cavity 16. Further, a thickness of the metal block 17, that is, a distance between a first primary surface (17F) (which is one of front and back surfaces of the metal block 17) and a second primary surface (17S) (which is the other one of the front and back surfaces of the metal block 17), is slightly smaller than a plate thickness of the core substrate 11 and is larger than a thickness of the conductor circuit layer 12.

Further, the first primary surface (17F) and the second primary surface (17S) of the metal block 17, and four side surfaces (17A) between the first primary surface (17F) and second primary surface (17S) (that is, all outer surfaces of the metal block 17) are rough surfaces. Specifically, the metal block 17 is immersed in an acid solution (for example, an acid of which main components are sulfuric acid and hydrogen peroxide) for a predetermined time period to erode the surfaces and thereby the surfaces of the metal block 17 have an arithmetic average roughness (Ra) of 0.1 μm-3.0 μm (according to a definition of JIS B 0601-1994).

The electronic component 45 is formed, for example, by superposing a rewiring layer 32 on a semiconductor chip 30 (such as a CPU or a memory). The semiconductor chip 30 has a shape of a flat cuboid. A planar shape of the semiconductor chip 30 is a quadrangular shape that is slightly smaller than that of the metal block 17. Further, the semiconductor chip 30 has pads (not illustrated in the drawings) on only a first primary surface (30F) (which is one of front and back surfaces) that corresponds to a terminal surface according to an embodiment of the present invention, and the rewiring layer 32 is superposed on the first primary surface (30F). The rewiring layer 32 is formed of, for example, insulating resin such as polyimide, and wiring that connects one surface to the other surface is made in the rewiring layer 32. The wiring in the rewiring layer 32 is finer on the semiconductor chip 30 side. By the wiring in the rewiring layer 32, the pads on the first primary surface (30F) of the semiconductor chip 30 are connected to pads (32A) that are provided on a surface of the rewiring layer 32 on a side opposite to the semiconductor chip 30 and are larger than the pads on the first primary surface (30F). That is, by the rewiring layer 32, sizes and arrangement and the like of the pads of the semiconductor chip 30 are modified. Then, a second primary surface (30S) of the semiconductor chip 30 on an opposite side of the first primary surface (30F) is fixed on the first primary surface (17F) of the metal block 17 by an adhesive. As the adhesive, a conductive adhesive excellent in thermal conductivity is used.

The entire combined component 46 combining the electronic component 45 and the metal block 17 has a thickness that is slightly larger than the plate thickness of the core substrate 11. The electronic component 45 slightly protrudes from the F surface (11F) of the core substrate 11, and the metal block 17 slightly protrudes from the S surface (11S) of the core substrate 11. A connection surface 45F (that is, one of the surfaces of the rewiring layer 32) that has the pads of the electronic component 45 is substantially flush with an outermost surface of the conductor circuit layer 12 on the F surface (11F) of the core substrate 11. On the other hand, the second primary surface (17S) of the metal block 17 is substantially flush with an outermost surface of the conductor circuit layer 12 on the S surface (11S) of the core substrate 11. Further, a gap between the metal block 17 and an inner surface of the cavity 16 is filled with a filling resin (16J) according to an embodiment of the present invention.

Both the build-up layer 20 on the F surface (11F) side of the core substrate 11 and the build-up layer 20 on the S surface (11S) side are formed by sequentially laminating, from the core substrate 11 side, a first insulating resin layer 21, a first conductor layer 22, a second insulating resin layer 23 and a second conductor layer 24. A solder resist layer 25 is laminated on the second conductor layer 24. Further, via holes (21H) and via holes (23H) are respectively formed in the first insulating resin layer 21 and the second insulating resin layer 23. The via holes (21H, 23H) are all formed in a tapered shape that is gradually reduced in diameter toward the core substrate 11 side. Further, the via holes (21H, 23H) are filled with plating and via conductors (21D, 23D) are formed. Then, the conductor circuit layer 12 and the first conductor layer 22, and, the metal block 17 and the first conductor layer 22, are connected by the via conductors (21D) of the first insulating resin layer 21; and the first conductor layer 22 and the second conductor layer 24 are connected by the via conductors (23D) of the second insulating resin layer 23. Further, pad holes are formed in the solder resist layer 25, and a portion of the second conductor layer 24 positioned in each of the pad holes becomes a pad 26.

On an F surface (10F) of the circuit substrate 10 (the F surface (10F) being an outermost surface of the build-up layer 20 on the F surface (11F) of the core substrate 11), the pads 26 include a group of large pads (26A) that are arranged in two rows along an outer edge of the product region (R2) and a group of small pads (26C) that are arranged in multiple vertical and horizontal rows in an inner side region surrounded by the group of the large pads (26A). For example, as illustrated in FIG. 2, the combined component 46 is arranged at a position directly below a quadrangular area of the group of the small pads (26C) excluding a surrounding row of the small pads (26C). Further, as illustrated in FIG. 3, a predetermined number of the small pads (26C) are connected via four via conductors (21D, 23D) to the electronic component 45 of the combined component 46. In contrast, on an S surface (10S) of the circuit substrate 10 (the S surface (10S) being an outermost surface of the build-up layer 20 on the S surface (11S) of the core substrate 11), three medium pads (26B) that are larger than the small pads (26C) form a substrate connecting part according to an embodiment of the present invention, and predetermined medium pads (26B) are connected to the metal block 17 via the via conductors (21D, 23D).

The circuit substrate 10 of the present embodiment is manufactured as follows.

(1) As illustrated in FIG. 4A, a substrate as the core substrate 11 is prepared that is obtained by laminating a copper foil (11C) on each of both front and back surfaces of an insulating base material (11K) that is made of epoxy resin or BT (bismaleimide triazine) resin and a reinforcing material such as a glass cloth.

(2) As illustrated in FIG. 4B, the tapered holes (14A) for forming the electrical conduction through holes 14 (see FIG. 3) are drilled by irradiating, for example, CO2 laser to the core substrate 11 from the F surface (11F) side.

(3) As illustrated in FIG. 4C, the tapered holes (14A) are drilled on the S surface (11S) side of the core substrate 11 by irradiating CO2 laser to positions directly on the back of the above-described tapered holes (14A) on the F surface (11F) side. The electrical conduction through holes 14 are formed from the tapered holes (14A, 14A).

(4) An electroless plating treatment is performed. An electroless plating film (not illustrated in the drawings) is formed on the copper foil (11C) and on inner surfaces of the electrical conduction through holes 14.

(5) As illustrated in FIG. 4D, a plating resist 33 of a predetermined pattern is formed on the electroless plating film on the copper foil (11C).

(6) An electrolytic plating treatment is performed. As illustrated in FIG. 5A, the electrical conduction through holes 14 are filled with electrolytic plating and the through-hole electrical conductors 15 are formed; and an electrolytic plating film 34 is formed on a portion of the electroless plating film (not illustrated in the drawings) on the copper foil (11C), the portion being exposed from the plating resist 33.

(7) The plating resist 33 is peeled off, and the electroless plating film (not illustrated in the drawings) and the copper foil (11C), which are below the plating resist 33, are removed. As illustrated in FIG. 5B, by the remaining electrolytic plating film 34, electroless plating film and copper foil (11C), the conductor circuit layer 12 is formed on the F surface (11F) of the core substrate 11, and the conductor circuit layer 12 is formed on the S surface (11S) of the core substrate 11. Then, the conductor circuit layer 12 on the F surface (11F) and the conductor circuit layer 12 on the S surface (11S) are in a state of being connected by the through-hole electrical conductors 15.

(8) As illustrated in FIG. 5C, the cavity 16 is formed in the core substrate 11 using a router or CO2 laser.

(9) As illustrated in FIG. 5D, a tape 90 made of a PET film is affixed to the S surface (11S) of the core substrate 11 so as to close the cavity 16.

(10) The metal block 17 is prepared. The metal block 17 is formed by cutting a copper plate or a copper block. In a state of being accommodated in a container having an acid resistant mesh structure, the metal block 17 is immersed for a predetermined period of time in an acid solution (for example, an acid of which main components are sulfuric acid and hydrogen peroxide) stored in a storage tank, and thereafter is washed with water. As a result, the entire surface of the metal block 17 becomes a rough surface.

(11) The electronic component 45 is prepared. A back surface (45S) of the electronic component 45 that does not have pads is affixed on the first primary surface (17F) of the metal block 17 by an adhesive.

(12) As illustrated in FIG. 6A, the combined component 46 is accommodated in the cavity 16 by a mounter (not illustrated in the drawings). In this case, the electronic component 45 of the combined component 46 is arranged on the F surface (11F) side of the core substrate 11, and the metal block 17 is arranged on the S surface (11S) side of the core substrate 11.

(13) As illustrated in FIG. 6B, a prepreg (a resin sheet of a B-stage formed by impregnating a core material with resin) as the first insulating resin layer 21 and a copper foil 37 are laminated on the conductor circuit layer 12 on the F surface (11F) of the core substrate 11, and thereafter, the resulting substrate is hot-pressed. In doing so, spacing between the conductor circuit layers (12, 12) on the F surface (11F) of the core substrate 11 is filled with the prepreg, and a gap between an inner surface of the cavity 16 and the combined component 46 is filled with thermosetting resin exuded from the prepreg.

(14) As illustrated in FIG. 6C, the tape 90 is removed.

(15) As illustrated in FIG. 6D, a prepreg as the first insulating resin layer 21 and a copper foil 37 are laminated on the conductor circuit layer 12 on the S surface (11S) of the core substrate 11, and thereafter, the resulting substrate is hot-pressed. In doing so, spacing between the conductor circuit layers (12, 12) on the S surface (11S) of the core substrate 11 is filled with the prepreg, and a gap between the inner surface of the cavity 16 and the combined component 46 is filled with thermosetting resin exuded from the prepreg. Further, the above-described filling resin (16J) is formed by the thermosetting resin that exudes from the prepregs on the F surface (11F) and the S surface (11S) of the core substrate 11 and is filled in the gap between the inner surface of the cavity 16 and the combined component 46.

Instead of the prepreg, it is also possible to use a resin film that does not contain a core material as the first insulating resin layer 21. In this case, without laminating a copper foil, a conductor circuit layer can be directly formed on a surface of the resin film using a semi-additive method.

(16) As illustrated in FIG. 7A, the via holes (21H) are formed by irradiating CO2 laser to the first insulating resin layers (21, 21) that are respectively formed on the front and back sides of the core substrate 11 by the prepregs. Here, among the via holes (21H) that are formed on the F surface (11F) side of the core substrate 11, some via holes (21H) are arranged on the conductor circuit layer 12 on the F surface (11F) of the core substrate 11 and some other via holes (21H) are arranged on the pads (32A) of the electronic component 45.

Further, among the via holes (21H) that are formed on the S surface (11S) side of the core substrate 11, some via holes (21H) are arranged on the conductor circuit layer 12 on the S surface (11S) of the core substrate 11 and some other via holes (21H) are arranged on the metal block 17. When the via holes (21H) are formed on the metal block 17, unevenness of the rough surface of the metal block 17 positioned on a deep side of the via holes (21H) may be eliminated by laser irradiation or by desmear after laser irradiation.

(17) An electroless plating treatment is performed. Electroless plating films (not illustrated in the drawings) are formed on the first insulating resin layers (21, 21) and in the via holes (21H, 21H).

(18) As illustrated in FIG. 7B, plating resists 40 of predetermined patterns are respectively formed on the electroless plating films on the copper foils 37.

(19) An electrolytic plating treatment is performed. As illustrated in FIG. 7C, the via holes (21H, 21H) are filled with plating and the via conductors (21D, 21D) are formed. Further, electrolytic plating films (39, 39) are formed on portions of the electroless plating films (not illustrated in the drawings) on the first insulating resin layers (21, 21), the portions being exposed from the plating resists 40.

(20) The plating resists 40 are removed, and the electroless plating films (not illustrated in the drawings) and the copper foils 37, which are below the plating resists 40, are removed. As illustrated in FIG. 8A, the first conductor layers 22 are respectively formed on the first insulating resin layers 21 on the front and back sides of the core substrate 11 by the remaining electrolytic plating films 39, electroless plating films and copper foils 37. Then, a state is achieved in which, on each of the front and back sides of the core substrate 11, a portion of the first conductor layer 22 and the conductor circuit layer 12 are connected by the via conductors (21D); and, the other portion of the first conductor layer 22 on the F surface (11F) side of the core substrate 11 and the pads (32A) of the electronic component 45 are connected by the via conductors (21D) and the other portion of the first conductor layer 22 on the S surface (11S) side of the core substrate 11 and the metal block 17 are connected by the via conductors (21D).

(21) By the same processing as described in the above (13)-(20), as illustrated in FIG. 8B, a state is achieved in which, on each of the front and back sides of the core substrate 11, the second insulating resin layer 23 and the second conductor layer 24 are formed on the first conductor layer 22, and a portion of the second conductor layer 24 and the first conductor layer 22 are connected by the via conductors (23D).

(22) As illustrated in FIG. 8C, the solder resist layers (25, 25) are respectively laminated on the second conductor layers 24 on the front and back sides of the core substrate 11.

Figure 9:
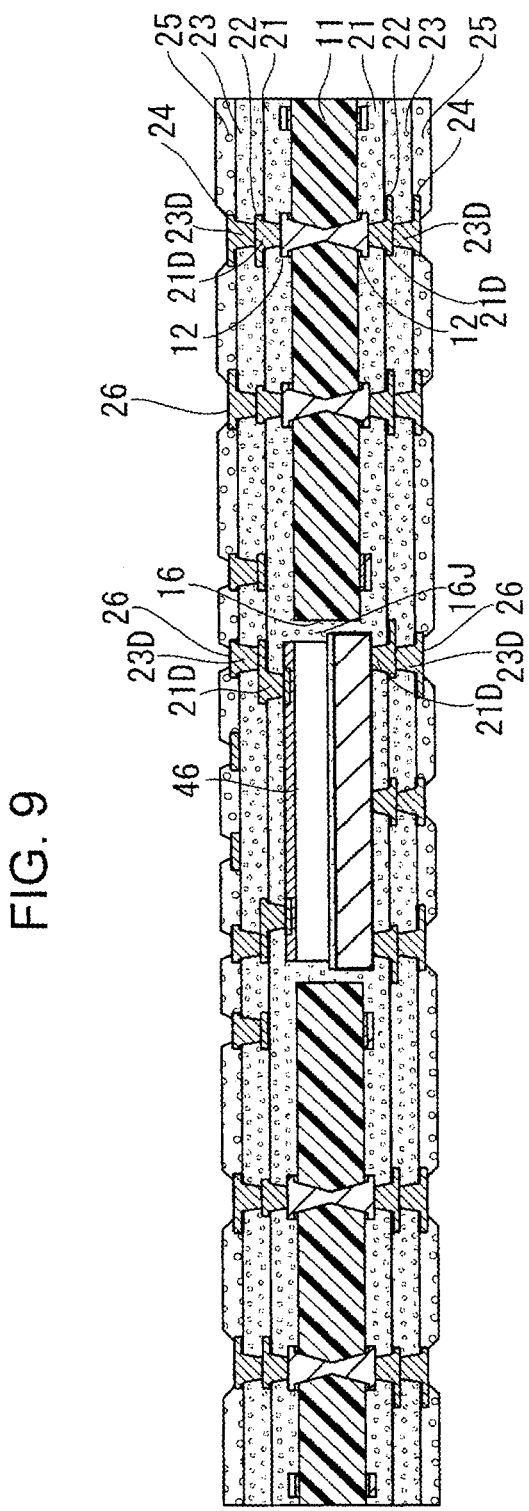
FIG. 9 is a cross-sectional side view illustrating a manufacturing process of the circuit substrate.

(23) As illustrated in FIG. 9, tapered pad holes are formed at predetermined places on the solder resist layers (25, 25) on the front and back sides of the core substrate 11, and portions of the second conductor layers 24 on the front and back sides of the core substrate 11 that are exposed from the pad holes become the pads 26.

(24) On each of the pads 26, a nickel layer, a palladium layer and a gold layer are laminated in this order and a metal film 41 illustrated in FIG. 3 is formed. As a result, the circuit substrate 10 is completed.

Figure 10:
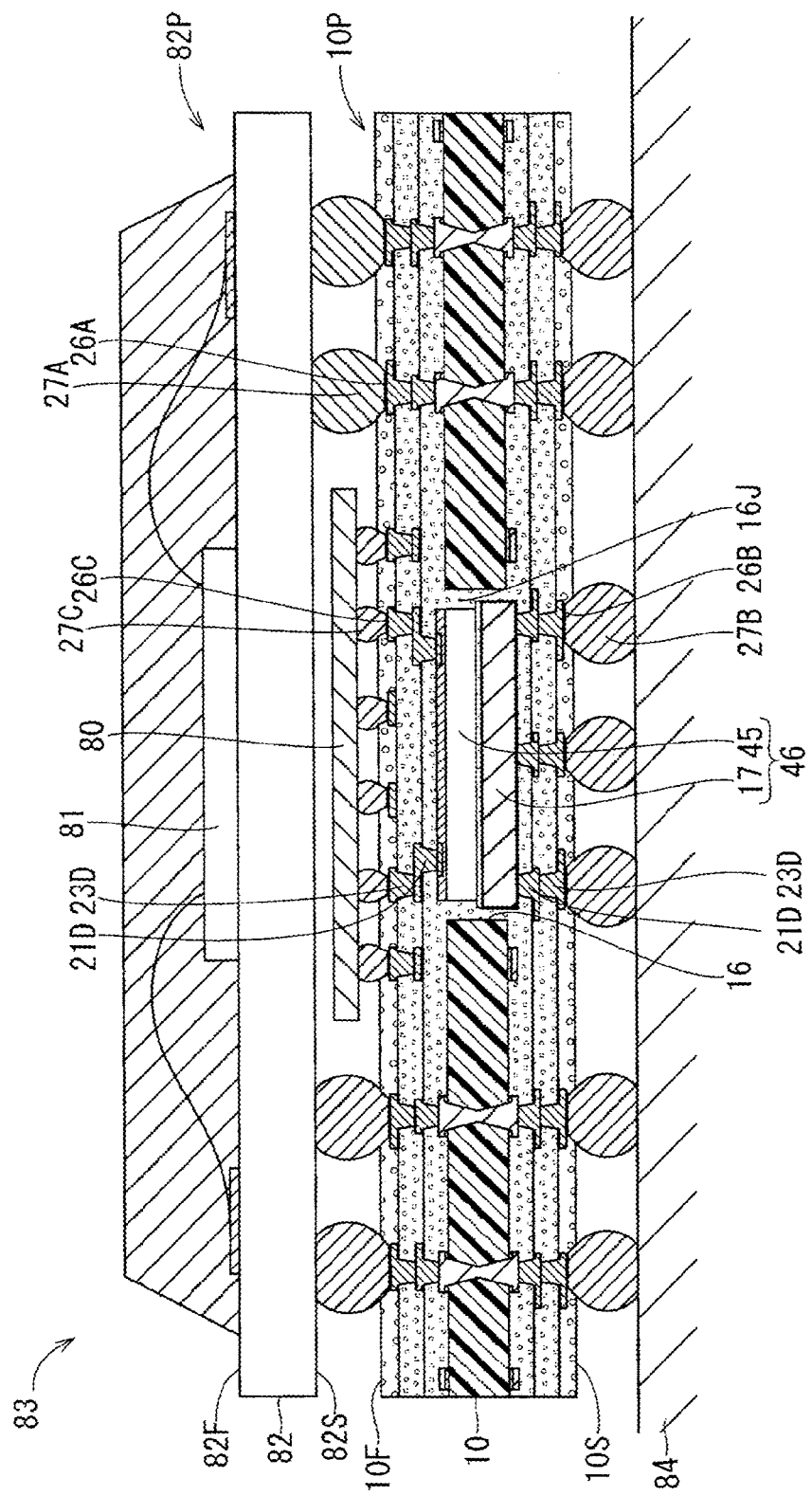
FIG. 10 is a cross-sectional side view of a PoP that includes the circuit substrate.

The description about the structure and the manufacturing method of the circuit substrate 10 of the present embodiment is as given above. Next, an operation effect of the circuit substrate 10 is described together with an example of use of the circuit substrate 10. The circuit substrate 10 of the present embodiment is used, for example, as follows. That is, as illustrated in FIG. 10, large, medium and small solder bumps (27A, 27B, 27C) that respectively match the sizes of the above-described large, medium and small pads (26A, 26B, 26C) of the circuit substrate 10 are respectively formed on the large, medium and small pads (26A, 26B, 26C). Then, for example, a CPU 80 having on a lower surface a pad group that is similarly arranged as the small pad group on the F surface (10F) of the circuit substrate 10 is mounted on and soldered to the group of the small solder bumps (27C) of each product region (R2), and a first package substrate (10P) is formed. In this case, the CPU 80 and the electronic component 45 are connected via the via conductors (21D, 23D).

Next, a second package substrate (82P) that is obtained by mounting a memory 81 on an F surface (82F) of a circuit substrate 82 is arranged from an upper side of the CPU 80 on the first package substrate (10P). The large solder bumps (27A) of the circuit substrate 10 of the first package substrate (10P) are soldered to pads that are provided on an S surface (82S) of the circuit substrate 82 of the second package substrate (82P). Thereby, a PoP 83 (Package on Package 83) is formed. Gaps between the circuit substrates 10, 82 in the PoP 83 are filled with resin (not illustrated in in the drawings).

Next, the PoP 83 is arranged on a motherboard 84. The medium solder bumps (27B) on the circuit substrate 10 of the PoP 83 are soldered to a pad group that the motherboard 84 has. In this case, for example, a pad for grounding that the motherboard 84 has is soldered to a pad 26 of the circuit substrate 10 that is connected to the metal block 17. When the motherboard 84 has pads dedicated to heat dissipation, the pads dedicated to heat dissipation and the metal block 17 of the circuit substrate 10 may be connected to each other via the via conductors (21D, 23D).

When the PoP 83 is used, both the CPU 80 and the electronic component 45 generate heat. Then, the heat of the electronic component 45 is transmitted to the metal block 17 and is dissipated from the metal block 17 to the motherboard 84 via the via conductors (21D, 23D) on the S surface (10S) side of the circuit substrate 10. As a result, temperature rise in the electronic component 45 is suppressed. Further, as a result, when the temperature of the electronic component 45 becomes lower than the temperature of the CPU 80, the heat of the CPU 80 is transmitted to the electronic component 45 and the metal block 17 via the via conductors (21D, 23D) on the F surface (10F) side of the circuit substrate 10, and is dissipated to the motherboard 84 via the via conductors (21D, 23D) on the S surface (10S) side of the circuit substrate 10. As a result, temperature rise in the CPU 80 that is mounted on the circuit substrate 10 can be suppressed. Further, in the circuit substrate 10, it is possible that a thermal expansion coefficient of the metal block 17 is greater than thermal expansion coefficients of other parts such as the first insulating resin layer 21 and the electronic component 45. However, the entire outer surface of the metal block 17 is a rough surface and is connected to the other parts by the adhesive and the filling resin (16J). Therefore, separation of the metal block 17 the other parts can be suppressed and fixation of the metal block 17 in the circuit substrate 10 can be stabilized. Further, by making the outer surface of the metal block 17 a rough surface, a contact area with the adhesive and the filling resin (16J) is increased and heat transmission efficiency is increased.

Second Embodiment

Figure 11:
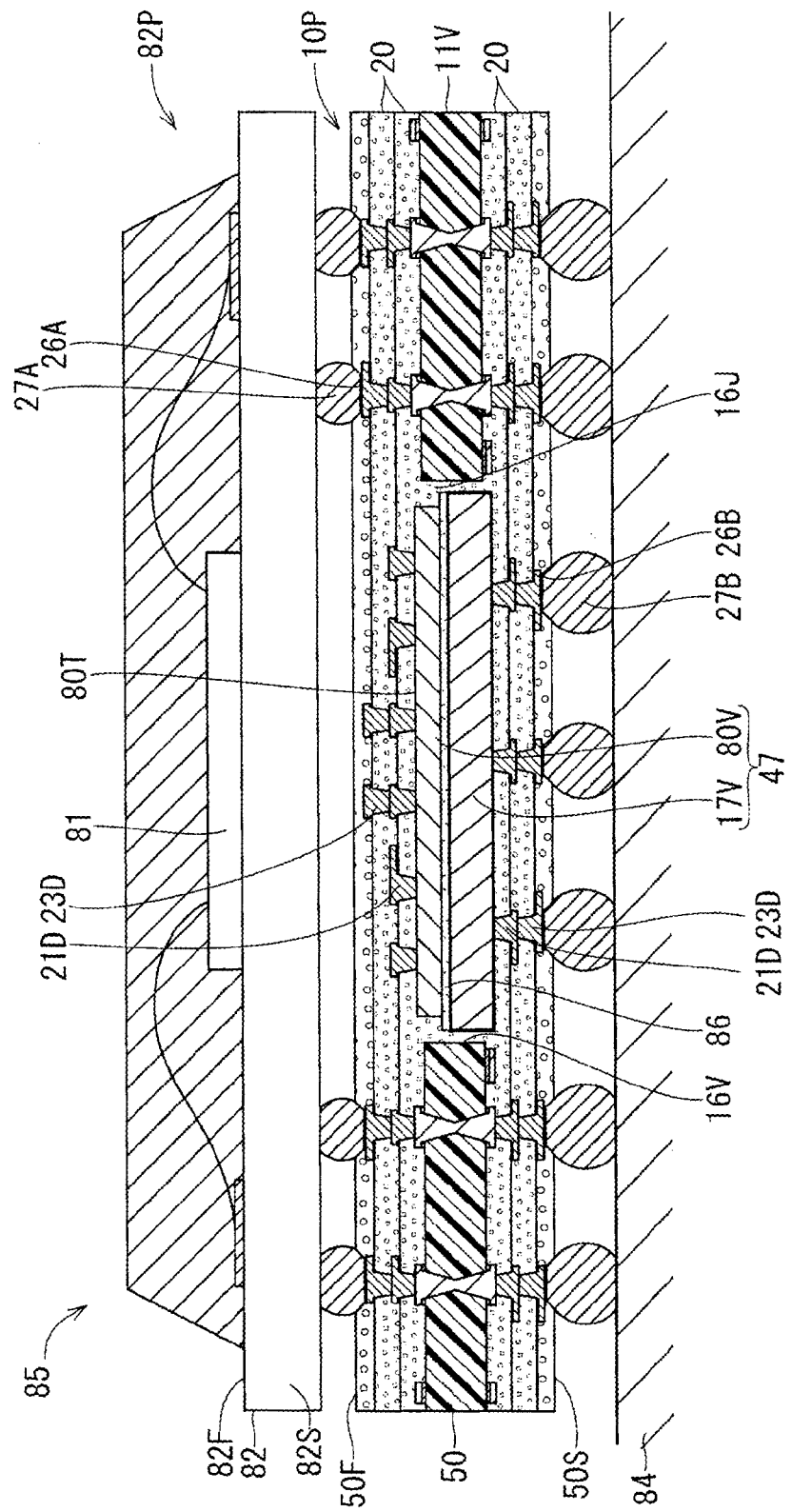
FIG. 11 is a cross-sectional side view of a combined substrate that includes a circuit substrate of a second embodiment.

In the circuit substrate 10 of the first embodiment, another electronic component (the CPU 80) that is connected to the electronic component 45 of the combined component 46 is mounted directly above the combined component 46 that is embedded in the core substrate 11. However, it is also possible that another electronic component is not mounted directly above the combined component. A combined substrate 85 that uses a circuit substrate 50 of the present embodiment is illustrated in FIG. 11. In the present embodiment, a combined component 47 that is formed from an electronic component (CPU (80V)) and a metal block (17V) is accommodated in a cavity (16V) that is formed in the core substrate (11V). Via conductors (21D) are connected to pads of a terminal surface (80T) of the CPU (80V).

In a method for manufacturing the circuit substrate 50 of the present embodiment, a method for accommodating the combined component 47 in the core substrate (11V) is different from that of the first embodiment. Specifically, after the cavity (16V) is formed in the core substrate (11V) and a tape 90 is affixed to an S surface of the core substrate (11V), first, only a roughened metal block (17V) is accommodated in the cavity (16V) using a mounter. Next, a bonding film is affixed to the metal block (17V) that is accommodated in the cavity (16V) to form a bonding layer 86. Next, the CPU (80V) with a surface on an opposite side of the terminal surface (80T) facing the metal block (17V) is accommodated in the cavity (16V) using a mounter and is pressed to be bonded. In this way, the combined component 47 that is formed by bonding the CPU (80V) and the metal block (17V) is accommodated in the cavity (16V). It is also possible that the formation of the bonding layer 86 is performed using a different method such as applying an adhesive using a spray. Further, it is also possible that the bonding is performed using a different method such as applying heat.

In the circuit substrate 50 of the present embodiment, it is easier for heat generated by the electronic component (CPU (80V)) to be released to an S surface (50S) side as compared to the case where an electronic component (the CPU 80) is mounted on a circuit substrate as in the first embodiment. Further, the electronic component does not protrude to an F surface (50F) side. Therefore, a thickness of the combined substrate 85 can be reduced.

Other Embodiments

The present invention is not limited to the above-described embodiments. For example, embodiments described below are also included in the technical scope of the present invention. Further, in addition to the embodiments described below, the present invention can also be embodied in various modified forms within the scope without departing from the spirit of the present invention.

(1) The surfaces of each of the metal blocks (17, 17V) of the above embodiments are roughened after the copper plate or the copper block is cut. However, the surfaces may also be roughened before the cutting. In this case, all the side surfaces or portions of the side surfaces of each of the metal blocks (17, 17V) are in a state of being not roughened.

(2) The surfaces of each of the metal blocks (17, 17V) of the above embodiments are roughened using an acid. However, for example, it is also possible that the roughening of the surfaces is performed by spraying particles or by pressing the surfaces against an uneven surface.

(3) The via conductors (21D, 23D) for releasing heat to the motherboard 84 outside the circuit substrates (10, 50) are connected to the metal blocks (17, 17V) of the above embodiments. However, it is also possible that the via conductors (21D, 23D) are not connected to the metal blocks (17, 17V). Even in such a structure, the metal blocks (17, 17V) absorb heat from the electronic components (the electronic component 45 and the CPU (80V)) and thereby rapid temperature rise in the electronic components can be suppressed. Further, heat can be released from the metal blocks (17, 17V) to an opposite side of the electronic components in the circuit substrates (10, 50).

In a circuit substrate, there may be a concern that, due to heat generation, temperature of the electronic component becomes high, causing the electronic component to malfunction.

A circuit substrate according to an embodiment of the present invention is capable of suppressing temperature rise of an electronic component that is accommodated in a cavity of a core substrate, and another embodiment of the present invention is a method for manufacturing such a circuit substrate.

A circuit substrate according to one aspect of the present invention includes: a core substrate; a cavity that penetrates through the core substrate; a combined component that is accommodated in the cavity; build-up layers that are respectively laminated on a front surface and a back surface of the core substrate and respectively contain insulating resin layers that cover the cavity; and a filling resin that is filled in a gap between the cavity and the combined component. The combined component is formed from an electronic component and a metal block, the electronic component having a terminal surface on a side facing the front surface, and the metal block being superposed to a surface opposite to the terminal surface.

Obviously, numerous modifications and variations of the present invention are possible in light of the above teachings. It is therefore to be understood that within the scope of the appended claims, the invention may be practiced otherwise than as specifically described herein.

What is claimed is:

1. A circuit substrate, comprising:
   a core substrate having a cavity penetrating through the core substrate;
   a combined component accommodated in the cavity of the core substrate;
   a first build-up layer laminated on a first surface of the core substrate and comprising an insulating resin layer such that the insulating resin layer is covering the cavity;
   a second build-up layer laminated on a second surface of the core substrate and comprising an insulating resin layer such that the insulating resin layer is covering the cavity; and
   a filling resin filling a gap formed between the core substrate and the combined component accommodated in the cavity of the core substrate,
   wherein the combined component comprises an electronic component and a metal block, the electronic component has a terminal surface on a side facing the first surface of the core substrate, the metal block is superposed to a surface of the electronic component on an opposite side of the electronic component with respect to the terminal surface, the first build-up layer comprises a plurality of via conductors connected to a plurality of terminal pads of the electronic component in the combined component, respectively, and the second build-up layer comprises a plurality of via conductors formed in the insulating resin layer of the second build-up layer and connected to a surface of the metal block of the combined component on an opposite side with respect to the electronic component of the combined component.

2. A circuit substrate according to claim 1, wherein the core substrate comprises a first conductor circuit layer forming the first surface of the core substrate and a second conductor circuit layer forming the second surface of the core substrate, the combined component is accommodated in the cavity of the core substrate such that the terminal surface of the electronic component is positioned substantially flush with the first surface of the core substrate and the metal block has the surface positioned substantially flush with the second surface of the core substrate.

3. A circuit substrate according to Claim 1, wherein the core substrate comprises a first conductor circuit layer forming the first surface of the core substrate and a second conductor circuit layer forming the second surface of the core substrate, and the combined component is accommodated in the cavity of the core substrate such that the terminal surface of the electronic component is positioned at an interface between the first build-up layer and the first conductor circuit layer and the metal block has the surface positioned at an interface between the second build-up layer and the second conductor circuit layer.

4. A circuit substrate according to claim 3, wherein the metal block has a thickness which is greater than a thickness of each of the first and second conductor circuit layers.

5. A circuit substrate according to claim 1, wherein the metal block has a surface facing the electronic component and having a width which is greater than a width of a surface of the electronic component facing the metal block.

6. A circuit substrate according to claim 1, wherein the combined component comprises a conductive adhesive layer formed between the metal block and the electronic component such that the conductive adhesive layer is adhering the metal block and the electronic component.

7. A circuit substrate according to claim 1, wherein the surface of the metal block includes a roughened surface having an arithmetic average roughness in a range of 0.1 to 3.0 such that the roughened surface is in contact with the insulating resin layer of the second build-up layer.

8. A circuit substrate according to claim 1, wherein the first build-up layer has an electronic component mounting structure positioned directly above the combined component and configured to mount a second electronic component on an outer surface of the first build-up layer, and a substrate mounting structure positioned to surround the electronic component mounting structure and configured to mount a second circuit substrate on the outer surface of the first build-up layer.

9. A circuit substrate according to claim 1, wherein the metal block is connected to a grounding circuit formed in the second build-up layer.

10. A circuit substrate according to claim 2, wherein the core substrate comprises a first conductor circuit layer forming the first surface of the core substrate and a second conductor circuit layer forming the second surface of the core substrate, and the combined component is accommodated in the cavity of the core substrate such that the terminal surface of the electronic component is positioned at an interface between the first build-up layer and the first conductor circuit layer and the metal block has the surface positioned at an interface between the second build-up layer and the second conductor circuit layer.

11. A circuit substrate according to claim 10, wherein the metal block has a thickness which is greater than a thickness of each of the first and second conductor circuit layers.

12. A circuit substrate according to claim 2, wherein the metal block has a surface facing the electronic component and having a width which is greater than a width of a surface of the electronic component facing the metal block.

13. A circuit substrate according to claim 2, wherein the combined component comprises a conductive adhesive layer formed between the metal block and the electronic component such that the conductive adhesive layer is adhering the metal block and the electronic component.

14. A circuit substrate according to claim 2, wherein the surface of the metal block includes a roughened surface having an arithmetic average roughness in a range of 0.1 to 3.0 such that the roughened surface is in contact with the insulating resin layer of the second build-up layer.

15. A circuit substrate according to claim 2, wherein the first build-up layer has an electronic component mounting structure positioned directly above the combined component and configured to mount a second electronic component on an outer surface of the first build-up layer, and a substrate mounting structure positioned to surround the electronic component mounting structure and configured to mount a second circuit substrate on the outer surface of the first build-up layer.

16. A circuit substrate according to claim 2, wherein the metal block is connected to a grounding circuit formed in the second build-up layer.

17. A method for manufacturing a circuit substrate, comprising:
  forming a cavity penetrating through a core substrate;
  proving a combined component comprising an electronic component and a metal block in the cavity of the core substrate;
  filling a filling resin into a gap formed between the core substrate and the combined component accommodated in the cavity of the core substrate;
  forming a first build-up layer comprising an insulating resin layer on a first surface of the core substrate such that the insulating resin layer covers the cavity; and
  forming a second build-up layer comprising an insulating resin layer on a second surface of the core substrate such that the insulating resin layer covers the cavity,
  wherein the forming of the first build-up layer comprises forming a plurality of via conductors connected to a plurality of terminal pads of the electronic component in the combined component, respectively, and the foil ling of the second build-up layer comprises forming a plurality of via conductors in the insulating resin layer of the second build-up layer such that the plurality of via conductors in the insulating resin layer of the second build-up layer is connected to a surface of the metal block of the combined component on an opposite side with respect to the electronic component of the combined component.

18. A method for manufacturing a circuit substrate according to claim 17, further comprising:
  adhering the metal block and the electronic component such that the combined component is formed,
  wherein the providing of the combined component comprises accommodating the combined component comprising the electronic component and the metal block into the cavity.

19. A method for manufacturing a circuit substrate according to claim 17, wherein the providing of the combined component comprises positioning the metal block in the cavity and adhering the combined component onto the metal block in the cavity.

20. A method for manufacturing a circuit substrate according to claim 17, wherein the providing of the combined component comprises positioning the metal block in the cavity and adhering the combined component onto the metal block in the cavity such that the electronic component has a terminal surface on a side facing the first surface of the core substrate and the metal block is superposed to a surface of the electronic component on an opposite side of the electronic component with respect to the terminal surface.

* * * * *